United States Patent
Guo et al.

(10) Patent No.: US 9,803,108 B1
(45) Date of Patent: Oct. 31, 2017

(54) AQUEOUS COMPOSITIONS OF STABILIZED AMINOSILANE GROUP CONTAINING SILICA PARTICLES

(71) Applicant: Rohm and Haas Electronic Materials CMP Holdings, Inc., Newark, DE (US)

(72) Inventors: Yi Guo, Newark, DE (US); David Mosley, Lafayette Hill, PA (US); David L. Thorsen, Pitman, NJ (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/297,706

(22) Filed: Oct. 19, 2016

(51) Int. Cl.
*C09G 1/02* (2006.01)
*C09G 1/06* (2006.01)
*C09G 1/00* (2006.01)
*C09G 1/04* (2006.01)
*C09K 3/14* (2006.01)
*C09K 13/06* (2006.01)
*B24B 1/00* (2006.01)
*H01L 21/321* (2006.01)
*B24B 37/04* (2012.01)
*H01L 21/306* (2006.01)
*C01B 33/14* (2006.01)
*C01B 33/18* (2006.01)

(52) U.S. Cl.
CPC ............. *C09G 1/02* (2013.01); *B24B 1/00* (2013.01); *B24B 37/044* (2013.01); *C01B 33/14* (2013.01); *C01B 33/18* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,767,016 A | 6/1998 | Muroyama | |
| 6,582,623 B1 | 6/2003 | Grumbine et al. | |
| 6,646,348 B1 | 11/2003 | Grumbine et al. | |
| 7,753,974 B2 | 7/2010 | Miyabe et al. | |
| 8,017,524 B2 | 9/2011 | White et al. | |
| 8,119,529 B2 | 2/2012 | Guo et al. | |
| 8,444,728 B2 | 5/2013 | Guo et al. | |
| 9,028,572 B2 | 5/2015 | Grumbine et al. | |
| 9,303,188 B2 | 4/2016 | Grumbine et al. | |
| 2008/0287038 A1 | 11/2008 | Miyabe et al. | |
| 2009/0081927 A1 | 3/2009 | Grumbine et al. | |
| 2009/0291559 A1 | 11/2009 | White et al. | |
| 2010/0279507 A1 | 11/2010 | Guo et al. | |
| 2012/0258598 A1 | 10/2012 | Guo et al. | |
| 2013/0045598 A1* | 2/2013 | Guo | C09G 1/02 438/693 |
| 2015/0259574 A1* | 9/2015 | Grumbine | H01L 21/3212 438/693 |
| 2015/0267082 A1 | 9/2015 | Grumbine et al. | |
| 2015/0267083 A1 | 9/2015 | Ward et al. | |
| 2015/0376458 A1 | 12/2015 | Grumbine et al. | |
| 2015/0376459 A1 | 12/2015 | Grumbine et al. | |
| 2015/0376460 A1 | 12/2015 | Grumbine et al. | |

OTHER PUBLICATIONS

Jindal, et al, Chemical Mechanical Polishing of Dielectric Films Using Mixed Abrasive Slurries, Journal of the Electrochemical Society, 150 (5) G314-G318 (2003).
Plueddemann, Silane Coupling Agents, Plenum Press, pp. 1-72, 75-109; 1982.

* cited by examiner

*Primary Examiner* — Jiong-Ping Lu
(74) *Attorney, Agent, or Firm* — Andre E. C. Merriam

(57) ABSTRACT

The present invention provides aqueous chemical mechanical planarization (CMP) polishing compositions have excellent heat aging and shelf stability in the form of concentrates comprising a mixture of a compound containing two quaternary ammonium groups, such as hexabutyl $C_1$-$C_8$ alkanediammonium dihydroxides or salts thereof, preferably N,N,N',N',N',N'-hexabutyl-1,4-butanediammonium dihydroxide (HBBAH), and aminosilane group containing silica particles in the amount of from 1 to 30 wt. % or, preferably, from 15 to 22 wt. %, as solids based on the total weight of the composition, the composition having a pH ranging from 3 to 5 or, preferably, from 3.5 to 4.5 wherein the composition is stable against visible precipitation or sedimentation at a 15 wt. % solids content after heat aging at a temperature of 45° C. for at least 6 days.

11 Claims, No Drawings

AQUEOUS COMPOSITIONS OF STABILIZED AMINOSILANE GROUP CONTAINING SILICA PARTICLES

The present invention relates to aqueous chemical mechanical planarization (CMP) polishing compositions comprising a mixture of a compound containing two quaternary ammonium groups, such as N,N,N,N',N',N'-hexabutyl-1,4-butanediammonium dihydroxide (HBBAH), with aminosilane group containing silica particles.

Previously, those using aminosilanes in aqueous silica CMP polishing compositions have always had shipping stability issues. Such aqueous CMP polishing compositions work best when used at a pH of from 4.5 to 5. However, silica particles like to gel or aggregate in the pH range of 4 to 7.5, especially with silica particle solids above a weight percentage of 20%. Adding silane to the CMP polishing compositions to help with polishing can add a positive charge so less silica is needed; however, adding an aminosilane to CMP polishing compositions creates stability issues at a pH of 4 to 7. Addition of aminosilane can reduce the electrostatic repulsion of the silica surfaces in silica containing CMP polishing compositions, thereby decreasing their colloidal stability.

Previously known mixtures of aminosilane treated or derivatized silica particles and quaternary ammonium compound lack stability when exposed to an accelerated heat aging test. An accelerated heat aging test, for example, can be conducted at a temperature greater than room temperature (for example, 50° C.) in an oven to simulate the effects of prolonged storage of the mixture at room temperature, or to simulate the effects of poor temperature control during summer months. While stability goes up with dilution, it remains prohibitively expensive to ship aqueous silica slurry polishing compositions in a dilution below about 10 wt. %.

United States patent publication no. US20150267082, to Grumbine et al. discloses mixtures of two, a first and a second, silica particles, the first particle of which is a colloidal silica having an average particle size of from 10 to 130 nm and has a permanent positive charge of at least 10 mV and the second particle of which has a neutral or non-permanent positive charge and an average particle size of from 80 to 200 nm. The first silica particle is treated with an aminosilane and the second silica particle may be treated with a quaternary amine compound. Grumbine fails to disclose a detailed method for treating the first silica particle with the aminosilane. The CMP polishing composition of Grumbine fails to provide desirable shelf stability.

The present inventors have endeavored to solve the problem of providing aqueous silica CMP polishing compositions that contain aminosilanes and that provide shelf stable CMP polishing composition concentrates.

STATEMENT OF THE INVENTION

1. In accordance with the present invention, aqueous chemical mechanical planarization (CMP) polishing compositions comprising a mixture of a compound containing two quaternary ammonium groups, such as hexabutyl $C_1$-$C_8$ alkanediammonium dihydroxides or salts thereof, such as dihalides, preferably N,N,N,N',N',N'-hexabutyl-1,4-butanediammonium dihydroxide (HBBAH), and aminosilane group containing silica particles containing one or more cationic nitrogen atom in the amount of from 1 to 30 wt. %, or, preferably, from 15 to 22 wt. %, as solids based on the total weight of the composition, the composition having a pH ranging from 3 to 5 or, preferably, from 3.5 to 4.5, or, more preferably, from 3.5 to 4.25, wherein the total amount of cationic nitrogen atoms from the aminosilane on the silica particles and the compound containing two quaternary ammonium groups ranges from 170 to 500 or, preferably, 200 to 400 nM/m² silica particles in the aqueous CMP polishing composition, and, further wherein, the composition is stable against visible precipitation or sedimentation at a 15 wt. % solids content after heat aging at a temperature of 45° C. for at least 6 days.

2. The aqueous chemical mechanical planarization (CMP) polishing compositions as in item 1, wherein the aminosilane group containing silica particles comprise an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AEAPS) or N-aminoethyl-aminoethylaminopropyl trimethoxysilane (DEAPS aka DETAPS).

3. The aqueous chemical mechanical planarization (CMP) polishing compositions as in item 2, wherein the amount of aminosilane in nanomoles of cationic nitrogen atoms on the silica particle per square meter of silica particle surface area (nM/m² silica) ranges from 70 to 500, or, preferably, from 100 to 300 nM/m² silica or, more preferably, from 140 to 250 nM/m² silica.

4. The aqueous chemical mechanical planarization (CMP) polishing compositions as in any one of items 1, 2, or 3, above, wherein the compound containing two quaternary ammonium groups is chosen from hexabutyl $C_1$-$C_8$ alkanediammonium dihydroxides or salts thereof, such as dihalides, for example, N,N,N,N',N',N'-hexabutyl-1-6-hexanediammonium dihydroxide, preferably, N,N,N,N',N',N'-hexabutyl-1,4-butanediammonium dihydroxide (HBBAH).

5. The aqueous chemical mechanical planarization (CMP) polishing compositions as in any one of items 1, 2, 3 or 4, wherein the amount of the compound containing two quaternary ammonium groups ranges from 18 to 100 or, preferably, from 25 to 100 nM of the compound containing two quaternary ammonium groups per m² of the silica (nM/m² silica) in the aqueous CMP polishing composition.

6. The aqueous chemical mechanical planarization (CMP) polishing compositions as in any one of items 1, 2, 3, 4, or 5, above, wherein the z-average particle sizes (DLS) of the silica ranges from 10 nm to 250 nm silica, or, preferably, from 12 nm to 150 nm.

7. The aqueous chemical mechanical planarization (CMP) polishing compositions as in any one of items 1 to 6 above for use in polishing dielectrics or oxide containing substrates, wherein the compositions comprise no oxidizer compound, such as iron oxides.

8. The aqueous chemical mechanical planarization (CMP) polishing compositions as in any one of items 1 to 7, above, further comprising a buffer, which is a carboxylate of a (di)carboxylic acid pKa of 3 to 7, or, preferably, a pKa of from 3 to 6 in the amount of from 0 to 50 millimoles per kg (mm/kg), or, preferably, 0.1 to 10 mm/kg of total (wet) composition.

9. The aqueous chemical mechanical planarization (CMP) polishing compositions as in any one of items 1 to 8, above, consisting essentially of aminosilane group containing silica particles and having 7 wt. % or less or, preferably, 4 wt. % or less of silica particles not containing an aminosilane group, based on total silica solids.

10. In accordance with a separate aspect of the present invention, a method of making an aqueous CMP polishing composition comprises adjusting the pH of an aqueous aminosilane to from 3.5 to 8, preferably, from 3.5 to 4.5 with a strong acid, preferably, nitric acid, and allowing it to sit for a period of from 5 to 600 minutes, such as up to 120 minutes, to hydrolyze any silicate bonds in the aminosilane and form a hydrolyzed aqueous aminosilane containing one or more cationic nitrogen atoms per aminosilane molecule and adjusting the pH of an aqueous aminosilane to from 3 to 5, preferably, from 3.5 to 4.5 or, more preferably, from 3.5 to 4.25 with a strong acid; separately, adjusting the pH of an aqueous silica composition containing silica in the amount of from 15 to 30 wt. %, or, preferably, from 15 to 22 wt. %, as solids based on the total weight of aqueous silica composition and wherein the silica has a z-average particle size (DLS) of from 10 nm to 250 nm silica, or, preferably, from 12 to 150 nm, to from 3 to 5 or, preferably, from 3.5 to 4.5 with a strong acid, preferably, nitric acid to form an aqueous silica slurry; combining the aqueous silica slurry and the hydrolyzed aqueous aminosilane in an amount, expressed in nanomoles of cationic nitrogen atoms of aminosilane on the silica particle per square meter of silica particle surface area (nM/m² silica), ranges from 70 to 500 or, preferably, from 100 to 300 or, more preferably, from 140 to 250 nM/m² silica, with shearing to form an aminosilane group containing silica particle composition; and, combining the aminosilane group containing silica particle composition with a compound containing two quaternary ammonium groups to make the aqueous CMP polishing composition wherein the total amount of cationic nitrogen atoms from the aminosilane on the silica particles and the compound containing two quaternary ammonium groups ranges from 170 to 500 or, preferably, 200 to 400 nM/m² silica in the aqueous CMP polishing composition.

11. The method of making an aqueous CMP polishing composition as in item 10, wherein the aqueous aminosilane comprises an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AE-APS) or N-aminoethylaminoethylaminopropyl trimethoxysilane (DEAPS aka DETAPS).

12. The method of making an aqueous CMP polishing composition as in any one of items 10 or 11, wherein the compound containing two quaternary ammonium groups, is chosen from hexabutyl $C_1$-$C_8$ alkanediammonium dihydroxides or salts thereof, such as dihalides, preferably N,N,N, N',N',N'-hexabutyl-1,4-butanediammonium dihydroxide (HBBAH).

13. The method of making an aqueous CMP polishing composition as in item 12, wherein the amount of the compound containing two quaternary ammonium groups ranges from 18 to 100 or, preferably, from 25 to 100 nM of the compound containing two quaternary ammonium groups per m² of the silica (nM/m² silica) in the aqueous CMP polishing composition.

14. The method of making an aqueous CMP polishing composition as in any one of items 10 to 13, further comprising diluting the aqueous CMP polishing composition to a total silica content of from 1 to 10 wt. %, based on the total weight of the composition.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) amine" refers to amine, polyamine, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "cationic nitrogen atom" refers to a quaternary ammonium nitrogen or an amine nitrogen in an aqueous composition where the pH of the solution is below the pKa of the protonated form of the amine. The "number of cationic nitrogen atoms" is determined according to a formula that adds the contributions of each positive charge containing nitrogen atom, as follows:

Total cationic nitrogen atoms=1×aminosilane+2×bis- or di-aminosilane+1×compound containing two quaternary ammonium groups, where the units are in nanomoles of cationic nitrogen atoms per m² of silica surface area.

As used herein, the term "colloidally stable" means that a given composition does not leave a visible sediment or precipitate, and shows less than 100% change in z-average particle diameter as measured by a Malvern DLS instrument after heat aging at 45° C. for 6 days.

As used herein, the term "hard base" refers to metal hydroxides, including alkali(ne earth) metal hydroxides, such as NaOH, KOH, or Ca(OH)$_2$.

As used herein, the term "heat aging" means visual observation after storage at the indicated temperature and for the indicated time as performed in sealed plastic or glass bottles in convection ovens. "Heat Aged Stability" means aging at 45° C. for 6 days without loss of clarity or colloidal stability and without an increase in z-average particle size of more than 200%, preferably, without an increase in z-average particle size of more than 100%.

As used herein, the term "ISO" refers to publications of the International Organization for Standardization, Geneva, CH.

As used herein, the term "silica particle solids" or "silica solids" means, for a given composition, the total amount of positively charged silica particles, plus the total amount of negatively charged silica particles, plus the total amount of any other silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a pK$_a$ of 2 or less, such as inorganic acids like sulfuric or nitric acid.

As used herein, the term "use conditions" means the temperature and pressure at which a given composition is used, including increases in temperature and pressure during use.

As used herein, the term "wt. %" stands for weight percent.

As used herein, the term "z-average particle size (DLS)" means the z-Average particle size of the indicated composition as measured by Dynamic Light Scattering (DLS) using a Malvern Zetasizer device (Malvern Instruments, Malvern, UK) calibrated per manufacturers recommendations. The z-Avg particle size is the intensity-weighted harmonic mean size, which is a diameter, as calculated by an ISO method. (ISO13321:1996 or its newer pendant ISO22412:2008). The term "number average mean diameter" or "($D_\#$)" is calculated using the Malvern non negative least squares distribution analysis with a setting of 'general purpose,' 70 size classes, and a regularizer value of 0.01. The non negative least squares analysis is described by Provencher (S. W. Provencher, *Commit. Phys. Commun.* 27 (1982), 229). Particle size measurements were made on the concentrated slurries or diluted slurries as described in the examples. Unless otherwise indicated, all particle size measurements were made on slurries diluted to 1% w/w silica particle solids and having a pH ranging from 3.5 to 4.5. The pH of the dilute measured slurry was kept as near as possible to the pH of the concentrate.

As used herein, the term specific surface area (SSA) is the total surface area of the particles in $m^2$ per unit mass in grams. It is calculated by using the equation for a Sauter Mean Diameter, D[3,2]. The Sauter mean diameter is equal to 6 times the total particle volume divided by the total particle surface area. This rearranges to:

Total Surface Area=6*total particle volume/$D[3,2]$

The number average mean diameter is shifted down in size from the Z-average diameter, using a weighting factor which emphasizes smaller particles. This provides a better representation of surface area because surface area per unit mass is inversely proportional to particle size; additionally, this better accounts for aggregates because a small number of aggregates in a given sample can have a large impact on the calculated Z-average diameter without contributing significantly to the total surface area. By assuming 1 gram of particles, the above equation for Total Surface Area is converted into specific surface area using the equation, below. For silica particles, we use a density of 2.2 g/cm$^3$, and use a DLS number average mean diameter value ($D_\#$) in nanometers. Thus, Specific Surface Area in g/m$^2$ is given by the following equation:

$$\text{Specific Surface Area} = \frac{6}{\text{particle density} * D_\#} = \frac{2720}{D_\#}$$

As used herein, the term "weight average silica specific surface area" for a two particle mixture refers to the result determined by:

$$Wt\ Av\ Silica\ SSA = \left(\frac{Wt_a * SSA_a + Wt_b * SSA_b}{Wt_a + Wt_b}\right)$$

Where $Wt_a$ and $Wt_b$ refer to the weights or weight fractions of particles a and b in a mixture, and $SSA_a$ and $SSA_b$ refer to the specific surface areas of those particles calculated as described above. In the case of mixtures of more than two kinds of particles, the above formula can be expressed as a summation adding, for each kind of particle up to n kinds of particles ($Wt_n \times SSA_n/Wt_{total}$).

As used herein, the term "zeta potential" refers to the charge of a given composition as measured by a Malvern Zetasizer instrument. All zeta potential measurements were made on (diluted) slurry compositions as described in the examples. The reported value was taken from an averaged measurement of zeta values using >20 acquisitions taken by the instrument for each indicated composition.

The present inventors have surprisingly found that aqueous compositions comprising a compound containing two quaternary ammonium groups, such as N,N,N,N',N',N'-hexabutyl-1,4-butanediammonium dihydroxide (HBBAH), and one or more aminosilane group containing silica particle composition, wherein the aminosilanes are on the surface of a silica particle provide a unique ability to stabilize the slurries for storage, shipment and heat aging while maintaining a high removal rate. The aqueous compositions containing the mixture of the silica particles remain colloidally stable at room temperature for >1 month. The present invention achieves aqueous silica slurry storage stability without requiring an additional growth step of the particles.

In accordance with the present invention, suitable compounds containing two quaternary ammonium groups may comprise N,N,N,N',N',N'-hexabutyl-1,4-butanediammonium dihydroxide (HBBAH).

In accordance with the present invention, suitable amounts of the compound containing two quaternary ammonium groups ranges from 25 to 2000 ppm or, preferably, from 200 to 2000 ppm of a slurry having a silica solids content of from 1 to 30 wt. % or, preferably, from 15 to 24 wt. %. The amount should be sufficient to ensure a stabilizing effect. More of the compound containing two quaternary ammonium groups is needed to stabilize concentrates and compositions having a higher silica concentration and/or a lower aminosilane concentration. More is also need to stabilize smaller average size particles owing to their increased surface area and potential for oligomerization or gelling.

Known quaternary ammonium salts or hydroxides tested do not provide the degree of heat age stability combined with removal rate desired for a commercial CMP polishing composition. One known quaternary ammonium compound, 1-butyl-3-methylimidazolium chloride (BMIC), can only provide adequate stability at a concentration level so high that it will reduce the overall removal rate of the CMP polishing composition.

To ensure colloidal stability of the aqueous CMP polishing compositions of the present invention, the compositions have a pH ranging from 3 to 5 or, preferably, from 3.5 to 4.5. The compositions tend to lose their stability above the desired pH range.

In accordance with the compositions of the present invention, the aminosilane group containing silica particles are used in amounts such that more aminosilane is used with smaller silica particles (that have more surface area) and less aminosilane is used with larger silica particles. For controlling colloidal stability, the number of cationic nitrogen atoms in the aminosilane per unit surface area of the silica particles in the pH range of less than 5 should remain low and yet cause the silica particles to have a positive zeta potential. However, too many cationic nitrogen atoms per surface area of silica particles can lead to a loss in polishing ability of the slurry, as measured by removal rates of TEOS wafers. The number of cationic nitrogen atoms to a unit of silica surface area is also a function of the porosity, density, and silanol concentration of the silica particle surface; more aminosilane is needed for more porous or less dense silica particles as well as for silica having more silanol groups on its surface.

The colloidal stability of the compositions of the present invention relates to the number of positive charges associated with the silica particle surface, expressed as nanomoles cationic nitrogen atoms per meter squared of silica surface area. Tertiary and secondary aminosilanes having one amine group contribute one positive charge or cationic nitrogen atom per aminosilane molecule at the pH of the present invention (3 to 5) because the amino group is protonated. Bis(amino) silanes and aminosilanes containing two amine groups, such as N-(2-aminoethyl)-3-aminopropylsilanes contribute approximately 2 positive charges or cationic nitrogen atoms per aminosilane molecule at the pH of the compositions of the present invention. Without wishing to be bound by theory, in compositions containing the diquaternary compounds of the present invention, one positive charge acts as a counterion to a deprotonated silanol group, while the other positive charge faces out into solution providing a positively charged cationic nitrogen atom. Other quaternary compounds, such as those having one quaternary ammonium group are unable to work by this mechanism, and hence do not enable the inventive combination of polishing performance and colloidal stabilizing.

The compositions of the present invention contain an amount of "cationic nitrogen atoms per unit silica surface area," in units of nanomoles per meter squared of silica surface area (nM/m$^2$ silica).

Suitable aminosilanes for use in making the aminosilane group containing silica particles of the present invention are tertiary amine group and secondary amine group containing aminosilanes. The aminosilanes in the compositions of the present invention are present as hydrolyzed aqueous aminosilanes during initial mixing, but can quickly become sorbed on the surface of the silica particles.

In accordance with the hydrolyzed aqueous aminosilane of the present invention, an aqueous aminosilane composition is allowed to sit so as to hydrolyze any silicate bonds formed on storage. For aminosilanes containing one or more secondary amine groups, the pH of such aqueous aminosilanes is maintained at from 7 to 8 for from 5 to 600 minutes, such as for 5 to 120 minutes, before the pH is adjusted to from 3.5 to 5 with a strong acid. The tertiary amine group containing aminosilanes are more readily hydrolyzed at the desired pH range of the aqueous silica CMP polishing compositions of the present invention (pH 3 to 5) than are primary amine group containing aminosilanes. A small percentage of the aminosilanes may exist as short chain oligomers after the hydrolysis step.

As aminosilanes having one or more secondary amine groups are less preferred, the preferred method of making a hydrolyzed aqueous aminosilane comprises adjusting the pH of the aqueous aminosilane of the present invention having one or more tertiary amino group, to a pH of from 3.5 to 4.5 and allowing it to sit for from 5 to 600 or from 5 to 120 minutes.

The composition of the present invention is intended for dielectric polishing, such as interlayer dielectrics (ILD).

EXAMPLES

The following examples illustrate the various features of the present invention.

In the Examples that follow, unless otherwise indicated, conditions of temperature and pressure are ambient temperature and standard pressure.

The following materials were used in the Examples that follow:

HBBAH=N,N,N,N',N',N'-hexabutyl-1,4-butanediammonium dihydroxide (Sachem, Austin, Tex.).

AEAPS=N-(2-aminoethyl)-3-aminopropyltrimethoxysilane, 98% (Gelest Inc., Morrisville, Pa.);

DEAMS=(N,N-diethylaminomethyl)triethoxysilane, 98%, (Gelest Inc.);

BMIC=1-butyl-3-methylimidazolium chloride, 98%, (Sigma-Aldrich, Milwaukee, Wis.);

BTMAC=Benzyltrimethylammonium chloride, 98% (Sigma-Aldrich).

The various silica particles used in the Examples are listed in Table A, below.

TABLE A

| | | Silica particles | | | | |
|---|---|---|---|---|---|---|
| Aqueous Silica Slurry | Source | pH | $D_\#^2$ (nm) | SSA$^3$ (m$^2$/g) | Nominal SSA$^4$ (m$^2$/g) | Concentration (wt. % solids) | Z-avg PS (nm) |
| Slurry A | Klebosol ™,1 1598-B25 | 7.7 | 23.6 | 115 | 110 | 30 | 35.3 |
| Slurry B | Klebosol ™,1 1598-B12 | 7.7 | 15.4 | 177 | 200 | 30 | 28.4 |
| Slurry C | Klebosol ™,1 30H50 | 2.5 | 59.3 | 46 | 50 | 30 | 77.0 |

[1]Merck KgAA, Darmstadt, Germany. All particles are spherical and produced from sodium silicate raw materials.
[2]Number average mean diameter by DLS.
[3]Calculated as 2720/$D_\#$.
[4]Reported specific surface areas from Merck KgAA for each product, not lot specific.

The following abbreviations were used in the Examples that follow:

POU: Point of use; RR: Removal rate; SA: Surface Area; SSA: Specific surface area.

The following test methods were used in the Examples that follow:

Initial pH and Aged pH: The "Initial pH" of compositions tested was that pH measured one time from the indicated concentrate compositions disclosed below at the time they were made; the "Aged pH" was measured one time after the time specified in the examples.

pH at POU: The pH at point of use (pH at POU) was that measured during removal rate testing after dilution of the indicated concentrate compositions with water to the indicated solids content.

Removal Rate: Removal rate testing from polishing on the indicated substrate was performed using the indicated polisher, such as a Strasbaugh 6EC 200 mm wafer polisher or "6EC RR" (San Luis Obispo, Calif.) or an Applied Materials Mirra™ 200 mm polishing machine or "Mirra RR" (Applied Materials, Santa Clara, Calif.), as indicated, at the indicated downforce and table and carrier revolution rates (rpm), and with the indicated CMP polishing pad and abrasive slurry at a 200 mL/min abrasive slurry flow rate. A Diagrid™ AD3BG-150855 diamond pad conditioner (Kinik Company, Taiwan) was used to condition the polishing pad. The CMP polishing pad was broken in with the pad conditioner using a down force of 6.35 kg (14.0 lb) for 20 minutes and was then further conditioned prior to polishing using a down force of 4.1 kg (9 lb) for 10 minutes. The CMP polishing pad was further conditioned in situ during polishing at 10 sweeps/min from 4.3 to 23.5 cm from the center of the polishing pad with a down force of 4.1 kg (9 lb). The removal rates were determined by measuring the film thickness before and after polishing using a KLA-Tencor FX200 metrology tool (KLA Tencor, Milpitas, Calif.) using a 49 point spiral scan with a 3 mm edge exclusion.

Z-Average Particle Size: The Z-Average particle size of the indicated composition was measured by Dynamic Light Scattering (DLS) using a Malvern Zetasizer device (Malvern Instruments, Malvern, UK) calibrated per manufacturers recommendations. The z-Avg particle size is the intensity-weighted harmonic mean size, which is a diameter, as calculated by an ISO method. (ISO13321:1996 or its newer pendant ISO22412:2008). Measurements of particle size were done on diluted particle samples at pHs as described in each example.

Zeta Potential: Zeta potential of the indicated compositions was measured by a Malvern Zetasizer instrument in the manner defined above. Measurements of zeta potential were done on compositions diluted to 1% w/w silica with a pH 3.5 solution, the compositions at or near a pH of 3.5.

Formulation Examples: In general, the indicated silica slurry particles diluted in water were adjusted to a pH 4.25 using nitric acid. A 2-4% w/w solution of pre-hydrolyzed aminosilane in water at pH 4.25 was added to the particles to make the resulting slurry composition the indicated millimoles of silane per kg of silica solids (mM/kg silica solids). The pH of the slurry was maintained between 3.5 and 4.25 for 3 hrs, and the content of silica solids at this point was ~18-24 wt. % of the total wet composition. The compositions were combined with the indicated amount of a compound containing two quaternary ammonium groups and, unless otherwise indicated, were aged at room temperature. Added amounts of quaternary or acid compounds in the tables below are given in units of millimolality (mm) using the total wet weight of the slurry, for example 3 millimoles of a compound in 1 kg of solution is 3 millimolal in compound. Specific formulating methods are detailed, below.

Removal Rate Testing: The slurry concentrates were diluted to 4% w/w in water for removal rate testing with no subsequent pH adjustment. A Strasbaugh 6EC 200 mm wafer polisher was run at 20.7 kPa (3 psi) with a table speed of 93 rpm, and a substrate carrier speed of 87 rpm. To test performance, tetraethoxysilane (TEOS) wafers were polished at a flow rate of 200 mL/min. unless otherwise indicated, an IC1010™ pad from Dow Electronic Materials was used. The 1010™ pad is a urethane pad 80 mils thick with a shore D hardness of 57 (The Dow Chemical Company, Midland, Mich., (Dow)).

Example 1: Effects of Aminosilane Level on Heat Aging Stability

The indicated compositions were allowed to sit for 13 calendar days before heat age testing was begun. Results are shown in Table 1, below.

TABLE 1

| | | | | | | | | | 29 Day (42 total days |
|---|---|---|---|---|---|---|---|---|---|
| | Silica solids | Aminosilane | | Initial | | | | | including |
| Example | (wt. %) | and amount[2] | HBBAH | RT pH's | 4 Day | 7 Day | 11 Day | 14 Day | sitting at RT) |
| 1A | 24% | DEAMS (127) | 230 ppm | 3.53 | OK | OK | OK | hazy | Gelled (PS = 118, Zeta = +22) |
| 1B | 24% | DEAMS (152) | 230 ppm | 3.55 | OK | OK | OK | OK | slight Haze (PS = 51, Zeta = +23) |

[1]50° C. visual observation; no buffer was used;
[2]nM/m$^2$ silica surface area;
*denotes comparative Example.

TABLE 1B

| | | | | | |
|---|---|---|---|---|---|
| | | | | | Total Cationic Nitrogen Atoms |
| | | Weight average silica | Mono- amino- | Compound Containing Two Quaternary | Total cationic nitrogen |
| | Silica | specific | silane | Ammonium | atom[1] |
| | (wt. | surface | (nM/m$^2$ | Groups | (nM/m$^2$ |
| Example | %) | area (m$^2$/g) | silica) | (nM/m$^2$ silica) | silica) |
| 1A* | 24 | 115 | 127 | 18.1 | 145 |
| 1B | 24 | 115 | 152 | 18.1 | 170 |

*-denotes comparative Example;
1. Monoanninosilane, dianninosilane, and diquaternary ammonium contribute 1, 2, and 1 ammoniums for stabilization respectively.

In Example 1A, to form a hydrolyzed aqueous aminosilane, a solution of 3.7% w/w of DEAMS was adjusted to pH 4.25 using nitric acid to yield 4.2 grams of hydrolyzed DEAMS solution. Separately, 29.42 grams of DI water was mixed with 144.3 grams of Slurry A. The pH of the silica slurry was reduced to 4.25 using nitric acid. The hydrolyzed DEAMS solution was then added to the silica solution with mixing. After 30 minutes of reaction between the DEAMS and silica, 2.07 g of a 2% w/w solution of HBBAH (nitrate form) at pH 3.5 was added. The resulting slurry was pH adjusted to 3.5 for heat aging using nitric/KOH as needed. In Example 1B, the amount of hydrolyzed DEAMS added was increased to 5.04 g and the water was decreased correspondingly. After 29 days of aging, the heat aged samples were measured by DLS for zeta potential and particle size by diluting the slurries to 1% solids in a pH 3.5 solution. In order to obtain DLS measurements of Sample 1A, it was first resuspended (although gel did not break) by adding extra pH 3.5 nitric acid solution and sonicating in a water bath.

As shown in Table 1, above, a sufficient level of DEAMS and HBBAH can prevent gelling over 4 weeks of storage at 50° C. at pH 3.5. The Examples 1A and 1B illustrate that raising the DEAMS level in the presence of HBBAH increases stability.

Example 2: Effect of Quaternary Ammonium on Heat Aging Stability

To make a DEAMS (124 nM/m$^2$ silica) slurry: 16.8 grams of DI water was mixed with 392 grams of Slurry A. The pH of the solution was reduced to 4.25 using nitric acid. To this mixture was added 11.2 grams of hydrolyzed DEAMS solution which was 3.7% w/w of the DEAMS monomer adjusted to pH 4.25 using nitric acid. After 30 minutes of reaction between the DEAMS and silica, the pH was adjusted to 4.0 using KOH and/or nitric acid. Aliquots of the DEAMS (124 nM/m$^2$ silica) solution which was 28% w/w silica were then used to prepare solutions of DEAMS (124 nM/m$^2$ silica) at 24% silica with added millimolal amounts of a quaternary ammonium and/or a carboxylic acid as shown in Table 2, below. The resulting slurries were pH adjusted to ~4.1 for heat aging using nitric/KOH as needed.

As shown in Table 2, below, HBBAH has the best stabilizing ability for the DEAMS (124 nM/m$^2$ silica) aminosilane group containing silica particles when stored at pH 4.1. As shown in Table 2B, below, the amount of cationic nitrogen atoms per meter squared of silica is not sufficient to stabilize the compositions after 6 days of heat aging. In Comparative Examples 2G, and 2M, BMIC, containing one imidazolium group gives a composition that performs nearly as well as the inventive HBBAH compound in Comparative Examples 2B, 2K and 2L containing two quaternary ammonium groups, but requires double the loading and gels after 6 days when using sarcosine as a buffer at pH 4.1. It is believed the two succinic acid examples show that maintaining heat stability at pH 4.4 is more difficult than at a pH of 4.1.

TABLE 2

Heat Aging Results for Various Quaternary Ammonium Compounds[2]

| EXAMPLE | QUAT (mm[3]) | Buffer[1] (mm) | Initial RT pH's | Heat aging after 24 hrs | Heat aging 2 Days | Heat aging 6 Days |
|---|---|---|---|---|---|---|
| 2A* | NONE | None | 4.30 | gelled | gelled | gelled |
| 2B* | HBBAH 0.5 mm (230 ppm) | None | 4.06 | OK | Milky w slight viscosity build | gelled |
| 2C* | Tetramethylguanidine 1 mm | None | 4.06 | slight haze | gelled | gelled |
| 2D* | Carnitine 1 mm | None | 4.05 | slight haze | gelled | gelled |
| 2E* | Choline 1 mm | None | 4.09 | haze | gelled | gelled |
| 2F* | Acetyl Choline 1 mm | None | 4.09 | slight haze | gelled | gelled |
| 2G* | BMIC 1 mm | None | 4.05 | OK | Milky w slight viscosity build | gelled |
| 2H* | tetramethylammonium 1 mm | None | 4.09 | OK | gelled | gelled |
| 2I* | BTMAC 1 mm | None | 4.08 | slight haze | gelled | gelled |
| 2J* | Bis(2-hydroxyethyl)dimethyl ammonium 1 mm | None | 4.1 | slight haze | gelled | gelled |
| 2K* | HBBAH 0.5 mm | Sarcosine 0.5 mm | 4.12 | OK | OK | Milky, w viscosity build up |
| 2L* | HBBAH 0.5 mm | Succinic 0.5 mm | 4.4 | Milky, but OK viscosity | gelled | gelled |
| 2M* | BMIC 1 mm | Sarcosine 0.5 mm | 4.13 | OK | OK | gelled |
| 2N* | BMIC 1 mm | Succinic 0.5 mm | 4.41 | milky | gelled | gelled |

[1]Sarcosine is n-methyl glycine;
[2]50° C. heat aging with visual observation;
[3]Millimolal (mm) = Millimoles/kg total wet weight;
*Denotes comparative Example.

TABLE 2B

Total Stabilizing Cationic Nitrogen Atoms

| Example | Silica (wt. %) | Weight average silica specific surface area ($m^2/g$) | Monoamino-silane ($nM/m^2$ silica) | Diamino-silane ($nM/m^2$ silica) | Diquaternary ammonium or Quat ($nM/m^2$ silica) | Total cationic nitrogen atoms[1] ($nM/m^2$ silica) |
|---|---|---|---|---|---|---|
| 2B* | 24 | 115 | 124 | 0 | 18.1 | 142 |
| 2K* | 24 | 115 | 124 | 0 | 18.1 | 142 |
| 2L* | 24 | 115 | 124 | 0 | 18.1 | 142 |
| 2G*, 2M*, 2N* | 24 | 115 | 124 | 0 | 36.2[2] | 160 |

*denotes comparative Example;
[1]Monoaminosilane, diaminosilane, and diquaternary ammonium contribute 1, 2, and 1 cationic nitrogen atoms, respectively;
[2]Reflects concentration of quat because twice as much is used; quat has one cationic nitrogen atom.

Example 3: Effect of HBBAH Level on Heat Aging

To make a DEAMS (156 $nM/m^2$ silica) slurries in 3A to 3F: 4.66 grams of DI water was mixed with 130.66 grams of Slurry A. The pH of the solution was reduced to 4.25 using nitric acid. To this mixture was added 4.67 grams of hydrolyzed DEAMS solution which was 3.7% w/w of the DEAMS monomer adjusted to pH 4.25 using nitric acid. After 60 minutes of reaction between the DEAMS and silica, the pH was adjusted to 4.0 using KOH and/or nitric acid. In Comparative Example 3A, the particle size of the DEAMS (156 $nM/m^2$ silica) solution without undergoing heat aging (storing at room temperature for 6 days) and without extra additives was 36.91 nm (Z-avg), measured at 1% solids and pH 3.5.

For DEAMS (154 $nM/m^2$ silica) slurries in 3G to 3L: 4.20 grams of DI water was mixed with 104.53 grams of Slurry A and 26.13 g of Slurry B. This gave an 80/20 mixture by weight, which had a weight averaged silica SSA of 127 $m^2/g$. The pH of the solution was reduced to 4.25 using nitric acid. To this mixture was added 5.13 grams of hydrolyzed DEAMS solution which was 3.7% w/w of the DEAMS monomer adjusted to pH 3.5 using nitric acid. After 20 minutes of reaction, the pH was adjusted to 4.2. After 60 minutes of reaction between the DEAMS and silica, the pH was adjusted to 4.0 using KOH and/or nitric acid Aliquots of the DEAMS (156 $nM/m^2$ silica) or (154 $nM/m^2$ silica) compositions with 28% w/w silica were then used to prepare slurries at 24 wt. % silica solids with the indicated added millimolal amounts of a quaternary ammonium and/or a carboxylic acid as shown in Table 3. The resulting slurries were pH adjusted to 4.1 for heat aging using nitric/KOH as needed, and aged at 50° C. for 6 days. Visual observations were made, and the solutions which had not significantly thickened were measured for particle size by diluting to 1% solids using pH 3.5 nitric acid solution and measuring at pH 3.5. Measurements of pH (noted with ^) for gelled examples were obtained by adding some water and sonicating to disperse the gel. The gel did not redisperse, but was liquified enough for a pH measurement.

TABLE 3

Effect of Concentration of Compound Containing Two Quaternary Ammonium Groups and Solids Content

| EXAMPLE | Aqueous Silica Slurry | Silane ($nM/m^2$ silica) | QUAT (mm[1]) | Buffer (mm[1]) | Initial RT pH's | Final pH | Heat aging[1] (6 Days) | Particle size (Z-avg, nm) |
|---|---|---|---|---|---|---|---|---|
| 3A* | A | DEAMS (156) | NONE | none | 4.09 | 4.41 | Hazy | 106.00 |
| 3B | A | DEAMS (156) | HBBAH 0.5 mm (230 ppm) | none | 4.09 | 4.47 | clear | 38.95 |
| 3C | A | DEAMS (156) | HBBAH 0.7 mm (323 ppm) | none | 4.08 | 4.42 | Clear | 38.42 |
| 3D | A | DEAMS (156) | HBBAH 0.9 mm (415 ppm) | none | 4.1 | 4.44 | Clear | 38.00 |
| 3E | A | DEAMS (156) | HBBAH 0.7 mm (323 ppm) | Sarcosine 5 mm | 4.1 | 4.4 | Clear | 40.00 |
| 3F | A | DEAMS (156) | HBBAH 0.7 mm (323 ppm) | Acetic Acid 5 mm | 4.11 | 4.16 | Clear | 41.67 |

TABLE 3-continued

Effect of Concentration of Compound Containing Two Quaternary Ammonium Groups and Solids Content

| EXAMPLE | Aqueous Silica Slurry | Silane (nM/m² silica) | QUAT (mm[1]) | Buffer (mm[1]) | Initial RT pH's | Final pH | Heat aging[1] (6 Days) | Particle size (Z-avg, nm) |
|---|---|---|---|---|---|---|---|---|
| 3G* | A and B | DEAMS (154) | None | None | 4.09 | 4.44 | Gelled | — |
| 3H* | A and B | DEAMS (154) | HBBAH 0.5 mm (230 ppm) | None | 4.09 | ^4.45 | Gelled | — |
| 3I* | A and B | DEAMS (154) | HBBAH 0.7 mm (323 ppm) | None | 4.09 | ^4.42 | viscous gelling | — |
| 3J | A and B | DEAMS (154) | HBBAH 0.9 mm (415 ppm) | None | 4.08 | ^4.43 | viscous | — |
| 3K | A and B | DEAMS (154) | HBBAH 0.7 mm (323 ppm) | Sarcosine 5 mm | 4.07 | ^4.33 | viscous gelling | — |
| 3L* | A and B | DEAMS (154) | HBBAH 0.7 mm (323 ppm) | Acetic Acid 5 mm | 4.1 | ^4.1 | Gelled | — |

*Denotes comparative Example;
[1]Millimolal (mm) = Millimoles/kg total wet weight of composition.

TABLE 3B

Total Stabilizing Cationic Nitrogen Atoms

| Example | Silica (wt. %) | Weight average silica specific surface area (m²/g) | Monoamino-silane (nM/m² silica) | Diamino-silane (nM/m² silica) | Diquaternary ammonium (nM/m² silica) | Total cationic nitrogen atoms[1] (nM/m² silica) |
|---|---|---|---|---|---|---|
| 3A* | 24% | 115 | 156 | 0 | 0 | 156 |
| 3B | 24% | 115 | 156 | 0 | 18.1 | 174 |
| 3C | 24% | 115 | 156 | 0 | 25.4 | 181 |
| 3D | 24% | 115 | 156 | 0 | 32.6 | 189 |
| 3E | 24% | 115 | 156 | 0 | 25.4 | 181 |
| 3F | 24% | 115 | 156 | 0 | 25.4 | 181 |
| 3G* | 24% | 127 | 154 | 0 | 0 | 154 |
| 3H* | 24% | 127 | 154 | 0 | 16.4 | 170 |
| 3I* | 24% | 127 | 154 | 0 | 23.0 | 177 |
| 3J | 24% | 127 | 154 | 0 | 29.5 | 184 |
| 3K | 24% | 127 | 154 | 0 | 23.0 | 177 |
| 3L* | 24% | 127 | 154 | 0 | 23.0 | 177 |

*denotes comparative Example;
[1]Monoaminosilane, diaminosilane, and diquaternary ammonium contribute 1, 2, and 1 ammoniums for stabilization respectively.

Tables 3 and 3B, above, show that increasing the level of the compound containing two quaternary ammonium groups at a 24 wt. % loading of aminosilane group containing silica particles provides greater protection against gelling during heat aging for both the Slurry A mixtures and the Slurry A/B mixtures. Tables 3A and 3B also show that the preferred or most effective level of a compound containing two quaternary ammonium groups and aminosilane increases for silica particles, such as those in Slurry B, having a larger surface area. Finally, in Example 3J, the Examples show that addition of an increasing amount of the compound containing two quaternary ammonium groups can improve the heat aging stability. In Comparative Examples 3H, 3I and 3L, a particle solids content of 24% makes stabilization difficult unless there are more than 25 nM/m² silica of a compound containing two quaternary ammonium groups, as in Example 3J or an effective buffer is used at a preferred pH, as in Example 3K.

Example 4: Effect of Compound Containing Two Quaternary Ammonium Groups with and without Acetate Buffer To make the DEAMS (140 nM/m² silica) slurry at 28% w/w silica: 12.83 grams of DI water was mixed with 326.66 grams of Slurry A. The pH of the solution was reduced to 4.25 using nitric acid. To this mixture was added 10.50 grams of hydrolyzed DEAMS solution which was 3.7% w/w of the DEAMS monomer adjusted to pH 4.25 using nitric acid. After 30 minutes of reaction between the DEAMS and silica, the pH was adjusted to 4.3 using KOH and/or nitric acid. The particle size of the aminosilane group containing silica particles (140 nM/m² silica) in the Examples 4A to 4S after 30 minutes at room temperature and without extra additives was 36.51 nm (Z-avg, done at 1 wt. % solids and pH 3.5). Aliquots of the DEAMS (140 nM/m² silica) solution were then used to prepare solutions at 24 wt. % aminosilane group containing silica particle solids with added millimolal amounts of a quaternary ammonium and/or acetic acid as shown in Tables 4A and 4B, below. The resulting slurries were pH adjusted to 4.2-4.3 for heat aging using nitric/KOH, as needed, and aged at 50° C. for 6 days.

TABLE 4A

Heat Aging[1] without a Buffer

| EXAMPLE | QUAT (mm) | Acetic acid (mm²) | Initial RT pH's | Heat aging (2 day) | Heat aging (6 Day) | 6 day pH | 6 day Particle size (Z-avg, nm) |
|---|---|---|---|---|---|---|---|
| 4A* | NONE | none | 4.33 | Gelled | gelled | | |
| 4B | HBBAH 0.5 mm | none | 4.30 | OK | OK, clear | 4.78 | 105.9 |
| 4C | HBBAH 0.9 mm | none | 4.27 | OK | OK, clear | 4.73 | 58.19 |
| 4D* | N,N,N',N'-tetramethylguanidine 0.9 mm | none | 4.34 | gel | gelled | | |
| 4E* | Carnitine 0.9 mm | none | 4.26 | thickened | gelled | | |
| 4F* | 1-butyl-3-methylimidazolium chloride 0.9 mm | none | 4.31 | thickened | milky, very viscous | | |
| 4G* | 1-butyl-3-methylimidazolium chloride 2 mm | none | 4.27 | OK | OK, clear | 4.71 | 89.44 |
| 4H* | Tetramethylammonium hydroxide 0.9 mm | none | 4.35 | Gel | gelled | | |
| 4H-1* | Benzyltrimethylammonium chloride 0.9 mm | none | 4.34 | Gel | gelled | | |

[1]50 = C. visual observation;
[2]Millimolal (mm) = Millimoles/kg total wet weight;
*Denotes comparative Example.

TABLE 4B

Heat Aging[1] with a Buffer

| EXAMPLE | QUAT (mm¹) | Acetic acid (mm¹) | Initial RT pH's | Heat aging² (2 day) | Heat aging² (6 Day) | 6 day pH | 6 day Particle size (Z-avg, nm) |
|---|---|---|---|---|---|---|---|
| 4I* | NONE | 0.4 mm | 4.34 | gelled | gelled | | |
| 4J | HBBAH 0.5 mm | 0.4 mm | 4.34 | OK | OK, clear | 4.67 | 89.57 |
| 4K | HBBAH 0.9 mm | 0.4 mm | 4.30 | OK | OK, clear | 4.63 | 53.87 |
| 4L* | N,N,N',N'-tetramethylguanidine 0.9 mm | 0.4 mm | 4.34 | thickened | milky, very viscous | | |
| 4M* | Carnitine 0.9 mm | 0.4 mm | 4.30 | thickened | milky, very viscous | | |
| 4N* | Carnitine 2 mm | 0.4 mm | 4.20 | milky | OK, clear | 4.38 | 109.9 |
| 4O* | 1-butyl-3-methylimidazolium chloride 0.9 mm | 0.4 mm | 4.30 | milky | OK, somewhat clear | 4.60 | 116 |
| 4P* | 1-butyl-3-methylimidazolium chloride 2 mm | 0.4 mm | 4.32 | OK | OK, clear | 4.63 | 83.41 |
| 4Q* | Tetramethylammonium hydroxide 0.9 mm | 0.4 mm | 4.32 | gel | gelled | | |
| 4R* | Tetramethylammonium hydroxide 2 mm | 0.4 mm | 4.33 | thickened | milky, very viscous | | |
| 4S* | Benzyltrimethylammonium chloride 0.9 mm | 0.4 mm | 4.33 | thickened | milky, very viscous | | |

[1]Millimolal (mm) = Millimoles/kg total wet weight;
[2]50° C. visual observation;
*Denotes comparative Example.

TABLE 4C

Total Stabilizing Cationic Nitrogen Atoms

| Example | Silica (wt.%) | Weight average silica specific surface area (m²/g) | Monoamino- silane (nM/m² silica) | Diamino- silane (nM/m² silica) | Diquaternary ammonium (nM/m² silica) | Total cationic nitrogen atoms[1] (nM/m² silica) |
|---|---|---|---|---|---|---|
| 4B | 24% | 115 | 140 | 0 | 18.1 | 158 |
| 4C | 24% | 115 | 140 | 0 | 32.6 | 173 |
| 4J | 24% | 115 | 140 | 0 | 18.1 | 158 |
| 4K | 24% | 115 | 140 | 0 | 32.6 | 173 |

*Denotes comparative Example;

[1]Monoaminosilane, diaminosilane, and diquaternary ammonium contribute 1, 2, and 1 ammoniums for stabilization, respectively.

As shown in Tables 4A and 4B, above, HBBAH in Examples 4B, 4C, 4J and 4K provides the best results for heat aging at 50° C., including providing the least particle growth relative to other quaternary ammoniums. In Comparative Examples 4G, 4N, 4O and 4P, BMIC can stabilize the compositions when used in unbuffered compositions at more than double the amount of HBBAH used; and, in buffered compositions, only when used at four times the amount as HBBAH (see Ex. 4J), can BMIC stabilize and carnitine nearly stabilize the slurry compositions after 6 days. These Examples, also demonstrate that a small amount of acetic acid as a carboxylate buffer can improve heat aging results somewhat by maintaining a lower z-average particle size.

Example 5: Effect of DEAMS on Aging

To make a DEAMS (181 nM/m² silica) slurry Example 5A: 1166.63 grams of DI water was mixed with 5599.94 grams of Slurry A. The pH of the solution was reduced to 4.25 using nitric acid. To this mixture was added 233.43 grams of hydrolyzed DEAMS solution which was 3.7% w/w of the DEAMS monomer adjusted to pH 4.25 using nitric acid. After 180 minutes of reaction between the DEAMS and silica, the pH was adjusted to 4.1 using KOH and/or nitric acid. For DEAMS (181 nM/m² silica) Example 5B, the same procedure was used but HBBAH (nitrate form) was added after 180 min to make the slurry 0.7 mm in HBBAH. For DEAMS (181 nM/m² silica) Example 5C, the same procedure was used but the monoacetate/mononitrate form of HBBAH was added after 180 min to make the slurry 0.7 mm in HBBAH and 0.7 mm in acetate. The results of heat aging at 45° C. are shown in TABLE 5A, below. Particle size measurements were done by diluting the slurry concentrates to 1% solid solutions with water.

TABLE 5A

Heat Aging at 45° C.

| Example | HBBAH (nM/m² silica SA) | Buffer (mm²) | Initial RT pH's | 7 day pH | 14 day pH | 28 day pH | Initial PS (Z-avg, nm) | Day 7 PS (Z-avg, nm) | Day 14 PS (Z-avg, nm) | Day 28 PS (Z-avg, nm) |
|---|---|---|---|---|---|---|---|---|---|---|
| 5A* | NONE* | none | 4.08 | 4.51 | 4.63 | gelled[1] | 39.4 | 120 | 380 | gelled[1] |
| 5B | HBBAH 25.4 (323 ppm) | none | 4.12 | 4.32 | 4.48 | 4.46 | 38.8 | 62.6 | 75.8 | 156.4 |
| 5C | HBBAH 25.4 (323 ppm) | Acetic acid 0.7 mm | 4.15 | 4.37 | 4.53 | 4.56 | 38.8 | 65.3 | 67.8 | 189.6 |

[1]visual observation;
[2]Millinnolal (mm) = Millimoles/kg total wet weight;
*Denotes comparative Example.

TABLE 5B

Polish of SiO2 surface (TEOS) on Strasbauch 6EC

| Example | QUAT (ppm) | Removal Rate of SiO₂ no heat aging (Ang/min) | Removal Rate of SiO₂ 3 weeks aging at 45 C. (Ang/min) |
|---|---|---|---|
| 5A* | NONE* | 2062 | gelled |
| 5B | HBBAH (323 ppm) | 2116 | 1984 |
| 5C | HBBAH (323 ppm) | 2109 | 2011 |

1. Millinnolal (mm) = Millimoles/kg total wet weight;
*-Denotes comparative Example

TABLE 50

Total Stabilizing Cationic Nitrogen Atoms

| Example | Silica (wt. %) | Weight average silica specific surface area (m$^2$/g) | Monoamino-silane (nM/m$^2$ silica) | Diamino-silane (nM/m$^2$ silica) | Diquaternary ammonium (nM/m$^2$ silica) | Total cationic nitrogen atoms[1] (nM/m$^2$ silica) |
|---|---|---|---|---|---|---|
| 5A* | 24 | 115 | 181 | 0 | 0 | 181 |
| 5B | 24 | 115 | 181 | 0 | 25.4 | 206.4 |
| 5C | 24 | 115 | 181 | 0 | 25.4 | 206.4 |

*denotes comparative Example;
[1]Monoaminosilane, diaminosilane, and diquaternary ammonium contribute 1, 2, and 1 ammoniums for stabilization respectively.

As shown in Table 5A, above, there is pH drift as the particle slurry ages. The presence of a small amount of acetate buffer doesn't affect the pH drift in a significant way in this example. However, in Examples 5B and 5C, the addition of HBBAH to the DEAMS-silica particles dramatically slows both particle size growth (z-average) and pH drift. As shown in Table 5B, above, the compositions of the present invention having a small amount of a buffer in Example 5C maintains its removal rate after heat aging for 3 weeks. The composition of Example 5B only lost from 6-7% of its removal rate after heat aging for 3 weeks. No removal rate data are available for the composition of Comparative Example 5A because that composition had gelled after heat aging for 3 weeks.

Example 6: Stabilizing Effect of HBBAH on Mixtures of Two Silica Particles

For DEAMS (199 nM/m$^2$ silica) slurries in Examples 6A to 6J: 32.66 grams of DI water was mixed with 160 grams of Slurry A. The pH of the solution was reduced to 4.25 using nitric acid. To this mixture was added 7.34 grams of hydrolyzed DEAMS solution which was 3.7% w/w of the DEAMS adjusted to pH 4.25 using nitric acid. After each of 10 and 60 minutes of reaction between the DEAMS and silica of Slurry A, the pH was adjusted to 4.2 using KOH and/or nitric acid. After 18 hours, the particles were adjusted to pH 3.5 using nitric and stored for 7 days.

The slurries in Table 6, below, were prepared by mixing the DEAMS-Slurry A (199 nM/m$^2$ silica) slurries after storage for 7 days with DI water and Slurry B particles (adjusted to pH 4.3 with glacial acetic acid). The slurries in Table 6 were made to have 18.6% w/w of Slurry A-DEAMS (199 nM/m$^2$ silica) particles, 1.4% w/w of the pH-adjusted Slurry B particles, and the amounts of extra HBBAH bisacetate salt and acetic acid. The weight average surface area of the Slurry A+B compositions was 119 m$^2$/g, reducing the mixture to a total of 192 nM DEAMS per m$^2$ of silica. The final pH of the concentrated particle slurries was set to be ~4.4 for heat aging studies using acetic acid or KOH to make the final pH adjustment. Heat aging was conducted for 27 days in a 50° C. oven. The starting particle size of the mixed particle system (Slurry A+B) before heat aging and without other additives was measured at 33.29 nm (Z-avg) at pH 4.4 and 1% solids. Particle sizes in Table 6 were measured by DLS at concentrations of 1% solids at pH 4.4. The total amounts of cationic nitrogen atoms are shown in Table 6B, below.

TABLE 6

Heat Aging[1] Of Mixed Aqueous Silica Slurry

| EXAMPLE | HBBAH bisacetate (nM/m$^2$ silica SA) | Extra acetic acid (mm$^3$) | Initial RT pH's | Heat aging[1] 15 day PS[2] (Z-avg) | Heat aging[1] 15 day pH | Heat aging[1] 27 day PS[2] (Z-avg) | Heat aging 27 day pH |
|---|---|---|---|---|---|---|---|
| 6A* | 0 | 0 | 4.43 | 56.95 | 4.60 | 123.90 | 4.54 |
| 6B | 33.6 (369 Ppm) | 0 | 4.44 | 43.74 | 4.56 | 62.00 | 4.48 |
| 6C | 33.6 | 1 | 4.53 | 46.05 | 4.55 | 65.59 | 4.45 |
| 6D | 33.6 (369 Ppm) | 2 | 4.41 | 44.34 | 4.52 | 62.20 | 4.44 |
| 6E | 33.6 | 5 | 4.40 | 54.72 | 4.48 | 80.40 | 4.43 |
| 6F | 39.9 | 0 | 4.44 | 43.22 | 4.56 | 57.22 | 4.51 |
| 6G | 39.9 | 2 | 4.42 | 47.14 | 4.52 | 66.31 | 4.49 |
| 6H | 46.2 | 0 | 4.45 | 42.52 | 4.56 | 57.92 | 4.51 |
| 6I | 68.5 (751 ppm) | 0 | 4.46 | 44.38 | 4.55 | 58.23 | 4.49 |
| 6J | 92.4 | 0 | 4.46 | 45.39 | 4.54 | 60.90 | 4.54 |

[1]50° C. aging;
[2]Particle size in nm;
[3]Millinnolal (mm) = Millimoles/kg total wet weight;
*Denotes comparative Example.

TABLE 6B

Total Stabilizing Cationic Nitrogen Atoms

| Example | Silica (wt. %) | Weight average silica specific surface area (m$^2$/g) | Monoamino-silane (nM/m$^2$ silica) | Diamino-silane (nM/m$^2$ silica) | Diquaternary ammonium (nM/m$^2$ silica) | Total cationic nitrogen atoms[1] (nM/m$^2$ silica) |
|---|---|---|---|---|---|---|
| 6A* | 20% | 119 | 192 | 0 | 0 | 192 |
| 6B | 20% | 119 | 192 | 0 | 33.6 | 226 |
| 6C | 20% | 119 | 192 | 0 | 33.6 | 226 |
| 6O | 20% | 119 | 192 | 0 | 33.6 | 226 |
| 6E | 20% | 119 | 192 | 0 | 33.6 | 226 |

TABLE 6B-continued

| | | Total Stabilizing Cationic Nitrogen Atoms | | | |
|---|---|---|---|---|---|
| Example | Silica (wt. %) | Weight average silica specific surface area (m²/g) | Monoamino-silane (nM/m² silica) | Diamino-silane (nM/m² silica) | Diquaternary ammonium (nM/m² silica) | Total cationic nitrogen atoms[1] (nM/m² silica) |
| 6F | 20% | 119 | 192 | 0 | 39.9 | 232 |
| 6G | 20% | 119 | 192 | 0 | 39.9 | 232 |
| 6H | 20% | 119 | 192 | 0 | 46.2 | 238 |
| 6I | 20% | 119 | 192 | 0 | 68.5 | 260 |
| 6J | 20% | 119 | 192 | 0 | 92.4 | 284 |

*denotes comparative Example;
[1]Monoanninosilane, diaminosilane, and diquaternary ammonium 1, 2, and 1 ammoniums contribute for stabilization respectively.

The results in TABLE 6 and 6B, above, show that increasing levels of HBBAH increase particle stability up to 1.63 mm or 751 ppm HBBAH as in Example 6I and above, as in Example 6J. In all of Examples 6B to 6J, the inventive HBBAH and aminosilane increased heat aged stability. In Example 6E adding too much acetic acid (which when neutralized is present as either HBBAH acetate or potassium acetate) at 6.6 mm (5 mm added plus 0.8*2 mm on the HBBAH salt) or 400 ppm and increasing the overall ionic strength of the solution leads to a less preferred level of particle stability. When comparing Comparative Examples 3G-3J from Table 3, above, to Examples 6B-6D, the heat aging results also show that increasing the DEAMS level on the particles and reducing the amount of the silica particle wt. % from 24 wt. % to a preferred 20 wt. % can increase stability dramatically as well, even in the presence of a fraction of roughly 7 wt. % of silica particles not containing aminosilane, based on particle solids. Including aqueous silica particles without aminosilane group containing silica particles is not preferred, especially at 4 wt. % or more of the total solids in the composition, and may hamper heat aged stability.

Example 7: Examples with Secondary Amine Group Containing Silane

For AEAPS (43.5 nM/m² silica) slurries: 18.81 grams of DI water was mixed with 80 grams of Slurry A. The pH of the solution was reduced to 4.25 using nitric acid. To this mixture was added 1.19 grams of hydrolyzed AEAPS solution which was 2.22% w/w of the AEAPS monomer adjusted to pH 4.25 using nitric acid. After 10 minutes of reaction between the AEAPS and silica, the pH was adjusted to 4.2 using KOH and/or nitric acid and stored at room temperature. The particles were used the next day to make aging formulations.

For the AEAPS (58 nM/m² silica) slurries: 18.41 grams of DI water was mixed with 80 grams of Slurry A and 1.59 grams of hydrolyzed AEAPS solution using the procedure above.

The slurries listed in TABLE 7A, below, were prepared by mixing the AEAPS (43.5 nM/m² silica) or (58 nM/m² silica) solutions with DI water and optionally Slurry B particles (30 wt. %, adjusted to pH 4.0 with nitric acid). Only Slurry A contained aminosilane group containing silica particles. When Slurry A and Slurry B were mixed as in Table 7A, the resulting weight-averaged specific surface area was 118 m²/g. The final pH of the concentrated particle slurries was set to be ~4.0 for heat aging studies using nitric acid or KOH to make the final pH adjustment. Heat aging was conducted for up to 12 days in a 50° C. oven. Particle sizes were measured at pH 4 using samples diluted to 1% solids with pH 4 nitric acid solution.

TABLE 7A

| | Secondary Amine Group Containing aminosilane group containing silica particle Formulations and Heat Aging at 50° C. | | | | | | | |
|---|---|---|---|---|---|---|---|---|
| EXAMPLE | AEAPS (nM/m² silica SA) and Slurry A Particle (wt. %) | Slurry B particle wt % | HBBAH (nM/m² silica SA) | Initial RT pH's | Heat aging 53 hrs | Heat aging 53 hrs PS[1] (Z-avg) | 12 day pH | 12 day Heat aging | Heat aging 12 days PS[1] (Z-avg) avg) |
| 7A* | AEAPS (43.5) 23% | 0% | None | 4.00 | gel | | | | |
| 7B* | AEAPS (43.5) 21.85% | 1.15% | None | 4.02 | gel | | | | |
| 7C | AEAPS (43.5) 23% | 0% | HBBAH bisacetate 98 | 4.04 | slight haze | 59.39 | 4.03 | haze | 90.47 |
| 7D* | AEAPS (43.5) 21.85% | 1.15% | HBBAH bisacetate 95.8 | 4.04 | slight haze | 84.06 | | gel | |

TABLE 7A-continued

Secondary Amine Group Containing aminosilane group containing silica particle Formulations and Heat Aging at 50° C.

| EXAMPLE | AEAPS (nM/m² silica SA) and Slurry A Particle (wt. %) | Slurry B particle wt % | HBBAH (nM/m² silica SA) | Initial RT pH's | Heat aging 53 hrs | Heat aging 53 hrs PS[1] (Z-avg) | 12 day pH | 12 day Heat aging | Heat aging 12 days PS[1] (Z-avg) |
|---|---|---|---|---|---|---|---|---|---|
| 7E* | AEAPS (43.5) 21.85% | 1.15% | HBBAH bisnitrate 95.8 | 4.00 | slight haze | 71.45 | | gel | |
| 7F* | AEAPS (58) 23% | 0% | None | 4.06 | haze | 133.50 | | gel | |
| 7G* | AEAPS (58) 21.85% | 1.15% | None | 4.05 | gel | | | | |
| 7H | AEAPS (58) 23% | 0% | HBBAH bisacetate 98 | 4.06 | slight haze | 42.93 | 4.06 | slight haze | 47.77 |
| 7I | AEAPS (58) 21.85% | 1.15% | HBBAH bisacetate 95.8 | 4.05 | slight haze | 49.96 | 4.08 | slight haze | 73.43 |

*denotes comparative Example;
[1]Particle size in nm.

TABLE 7B

Total Stabilizing Cationic Nitrogen Atoms

| Example | Silica (wt. %) | Weight average silica specific surface area (m²/g) | Monoamino-silane (nM/m² silica) | Diamino-silane (nM/m² silica) | Diquaternary ammonium (nM/m² silica) | Total cationic nitrogen atoms[1] (nM/m² silica) |
|---|---|---|---|---|---|---|
| 7A* | 23% | 115 | 0 | 43.5 | 0 | 87 |
| 7B* | 23% | 118 | 0 | 42.4 | 0 | 84.8 |
| 7C | 23% | 115 | 0 | 43.5 | 98 | 185 |
| 7D* | 23% | 118 | 0 | 42.4 | 95.8 | 180.6 |
| 7E* | 23% | 118 | 0 | 42.4 | 95.8 | 180.6 |
| 7F* | 23% | 115 | 0 | 58 | 0 | 116 |
| 7G* | 23% | 118 | 0 | 56.5 | 0 | 113 |
| 7H | 23% | 115 | 0 | 58 | 98 | 214 |
| 7I | 23% | 118 | 0 | 56.5 | 95.8 | 208.8 |

*denotes comparative Example;
[1]Monoanninosilane, dianninosilane, and diquaternary ammonium contribute 1, 2, and 1 ammoniums for stabilization, respectively.

As shown in Table 7A, above, Examples 7C, 7H and 7I exhibit improved stability effects from including a compound containing two quaternary ammonium groups, HBBAH (compare Comparative Examples 7A, 7B, 7F and 7G). Increasing the level of aminosilane for formulations using AEAPS, a secondary amine group containing silane can help heat age stability (compare Comparative Examples 7D and 7E with inventive Examples 7H and 7I). In combination with the buffer or salt, the preferred amount of the tested aminosilane containing a secondary amine group and having two cationic nitrogen atoms is that amount which provides more than 100 nM cationic nitrogen atoms per m² of silica. Including aqueous silica Slurry B without aminosilane group containing silica particles in the amount of 4 wt. % or more of total solids, as in Comparative 7D and 7E, is not preferred and may hamper heat aged stability.

Example 8: Heat Aging with Compositions of Silica Mixtures

The quantities of reagents are listed in TABLE 8A. DI water was mixed with Slurry A. The pH of the solution was reduced to 4.25 using nitric acid. To this mixture was added hydrolyzed DEAMS solution which was 3.7% w/w of the DEAMS monomer adjusted to pH 4.25 using nitric acid. After 30 minutes of reaction between the DEAMS and silica, the pH was readjusted to 4.25 using KOH and/or nitric acid. Then a 10% w/w solution of Slurry B pH-adjusted to 4.25, or as received Slurry C, was optionally added. A second addition of DEAMS solution was optionally performed. After another 30 min, HBBAH bisacetate (from a stock solution at pH 4.4) was added and the pH was readjusted to 4.4. The final solutions were heat aged in a convection oven at 50° C. for 28 days.

The formulations of 8D-1, 8E-1 and 8F-1 were adjusted to a pH of 3.5 using nitric acid. The formulations 8D-1, 8E-1 and 8F-1 were measured for particle size by diluting with pH 3.5 nitric to 1% solids. All other formulations in Example 8 were measured for particle size by diluting with pH 4.4 nitric acid solution to 1% solids.

TABLE 8A

Formulations

| Example | Slurry A particle wt % | First DEAMS add (mm[1]) | Slurry B | Slurry C | Second DEAMS add(mm[1]) | HBBAH mm[1] (ppm) |
|---|---|---|---|---|---|---|
| 8A | 18.6% | 4.6 | 1.4% | 0.00 | 0.00 | 0.80 (369) |
| 8B | 18.6% | 4.6 | 1.4% | 0.00 | 0.30 | 0.80 |
| 8C | 18.6% | 5.5 | 1.4% | 0.00 | 0.30 | 0.80 (369) |
| 8D | 18.6% | 1.9 | 1.4% | 0.00 | 0.30 | 2.60 (1198) |
| 8E | 20.0% | 1.9 | 0.0% | 4.0% | 0.00 | 2.60 |
| 8F | 20.0% | 1.9 | 0.0% | 4.0% | 0.30 | 2.60 |

[1]Millinnolal (mm) = Millimoles/kg total wet weight

TABLE 8B

Heat Aging at 50° C. Results and Effect of pH

| Example | 0 day pH | 0 day PS (Z-avg, nm) | 2 day pH | 2 day PS (Z-avg, nm) | 14 day pH | 14 day PS (Z-avg, nm) | 19 day pH | PS (Z-avg, nm) | 28 day pH | 28 day PS (Z-avg, nm) |
|---|---|---|---|---|---|---|---|---|---|---|
| 8A | 4.41 | 35.74 | 4.52 | 35.97 | 4.61 | 38.18 | 4.66 | 44.85 | 4.68 | 57.33 |
| 8B | 4.41 | 34.88 | 4.51 | 35.04 | 4.59 | 36.35 | 4.65 | 40.05 | 4.68 | 48.52 |
| 8C | 4.41 | 34.80 | 4.51 | 35.24 | 4.61 | 34.67 | 4.66 | 36.44 | 4.69 | 39.08 |
| 8D* | 4.25 | 37.29 | 4.30 | 47.48 | 4.28 | 107.50 | Gel | | | |
| 8E* | 4.26 | 58.74 | 4.31 | 95.10 | Gel | Gel | Gel | | | |
| 8F* | 4.25 | 55.84 | 4.30 | 67.22 | 4.26 | viscous | Gel | | | |
| 8D-1 | 3.50 | | 3.64 | 37.80 | 3.72 | 39.11 | 3.73 | 41.04 | 3.74 | 42.97 |
| 8E-1 | 3.50 | | 3.63 | 59.02 | 3.71 | 62.85 | 3.72 | 66.05 | 3.69 | 71.04 |
| 8F-1 | 3.50 | | 3.59 | 54.87 | 3.66 | 56.08 | 3.67 | 58.51 | 3.68 | 58.41 |

*denotes comparative Example.

TABLE 8B

Total Stabilizing Ammonium

| Example | Silica (wt. %) | Weight average silica specific surface area (m²/g) | Monoaminosilane (nM/m² silica) | Diaminosilane (nM/m² silica) | Diquaternary ammonium (nM/m² silica) | Total cationic nitrogen atoms[1] (nM/m² silica) |
|---|---|---|---|---|---|---|
| 8A | 20% | 119 | 193 | 0 | 34 | 227 |
| 8B | 20% | 119 | 206 | 0 | 34 | 240 |
| 8C | 20% | 119 | 244 | 0 | 34 | 278 |
| 8D* | 20% | 119 | 92 | 0 | 109 | 201 |
| 8E* | 24% | 104 | 76 | 0 | 104 | 180 |
| 8F* | 24% | 104 | 88 | 0 | 104 | 192 |
| 8D-1 | 20% | 119 | 92 | 0 | 109 | 201 |
| 8E-1 | 24% | 104 | 76 | 0 | 104 | 180 |
| 8F-1 | 24% | 104 | 88 | 0 | 104 | 192 |

*denotes comparative Example;
[1]Monoanninosilane, dianninosilane, and diquaternary ammonium contribute 1, 2, and 1 ammoniums for stabilization respectively.

As shown in Table 8B, above, in the heat aging results for Examples 8A, 8B, 8C, a combination of the aminosilane DEAMS and HBBAH provides slurries which show little particle growth after heat aging at 50° C. for 28 days at a pH of 4.4 to 4.6. As shown in Comparative Examples 8D, 8E and 8F, compositions having less than the preferred 140 nM/m² of aminosilane do not pass the stability test at a less preferred pH of 4.5 even though the total cationic nitrogens/m² are 180 or more. However, in Examples 8D-1, 8E-1 and 8F-1, at a pH of 3.5 addition of more than 1000 ppm HBBAH even in compositions having less than 100 nM of cationic nitrogen atoms per m² silica of aminosilane enables heat aging stability for aqueous silica slurry compositions having particles as small as Slurry B (25 nm) and as large as Slurry C (75 nm).

Example 9: Effect of pH on Stability

Aqueous silica slurry formulations after mixing are listed in Table 9A, below. DI water was mixed with Slurry A. The pH of the solution was reduced to 4.25 using nitric acid. To this mixture was added hydrolyzed DEAMS solution which was 3.7% w/w of the DEAMS monomer adjusted to pH 4.25 using nitric acid. After 30 minutes of reaction between the DEAMS and silica, the pH was readjusted to 4.25 using KOH and/or nitric acid. Then, as indicated in Table 9A, below, a 24% w/w solution of Slurry B pH-adjusted to 4.25, or as received Slurry C, was added. A second addition of DEAMS solution was optionally performed. After another 30 min, HBBAH bisacetate (from a stock solution at pH 4.4) was added and the pH was adjusted as listed in Table 9A, below, with nitric acid. The final solutions were heat aged in a convection oven at 45 C for 28 days.

TABLE 9A

Formulations

| Example | Slurry A (wt. %) | First DEAMS add (mm) | Slurry B (wt. %) | Slurry C (wt. %) | Second DEAMS add (mm) | HBBAH (mm) (ppm) | Final pH |
|---|---|---|---|---|---|---|---|
| 9A | 18.6% | 4.6 | 1.4% | 0 | 0.9 | 0.8 (369) | 4.40 |
| 9B | 18.6% | 5.5 | 1.4% | 0 | 0.3 | 0.8 | 4.40 |
| 9C | 20% | 1.9 | 0 | 4% | 0.9 | 2.6 (1198) | 3.56 |
| 9D | 20% | 1.9 | 0 | 4% | 0.3 | 2.6 | 3.54 |

TABLE 9B

Heat Aging at 45° C. Results

| Example | 0 day pH | 0 day PS (Z-avg, nm) | 7 day pH | 7 day PS (Z-avg, nm) | 14 day pH | 14 day PS (Z-avg, nm) | 28 day pH | 28 day PS (Z-avg, nm) |
|---|---|---|---|---|---|---|---|---|
| 9A | 4.37 | 32.1 | 4.43 | 32.12 | 4.51 | 32.32 | 4.53 | 32.67 |
| 9B | 4.36 | 32.155 | 4.42 | 31.935 | 4.52 | 32.08 | 4.87 | 32.575 |
| 9C | 3.42 | 58.99 | 3.48 | 58.08 | 3.50 | 58.33 | 3.52 | 58.815 |
| 9D | 3.41 | 59.045 | 3.47 | 57.915 | 3.51 | 58.075 | 3.51 | 58.65 |

*denotes comparative Example

TABLE 8C

Total Stabilizing Ammonium

| Example | Silica (wt. %) | Weight average silica specific surface area (m²/g) | Monoaminosilane (nM/m² silica) | Diaminosilane (nM/m² silica) | Diquaternary ammonium (nM/m² silica) | Total cationic nitrogen atoms[1] (nM/m² silica) |
|---|---|---|---|---|---|---|
| 9A | 20% | 119 | 231 | 0 | 34 | 265 |
| 9B | 20% | 119 | 244 | 0 | 34 | 278 |
| 9C | 24% | 104 | 112 | 0 | 104 | 216 |
| 9D | 24% | 104 | 88 | 0 | 104 | 192 |

*denotes comparative Example;
[1]Monoanninosilane, dianninosilane, and diquaternary ammonium contribute 1, 2, and 1 ammoniums for stabilization respectively.

As shown in Table 9B, above, the inventive compositions remain stable at a range of pHs from 3 to 5.

We claim:

1. An aqueous chemical mechanical planarization (CMP) polishing composition comprising a mixture of a compound containing two quaternary ammonium groups, and aminosilane group containing silica particles containing one or more cationic nitrogen atom in the amount of from 1 to 30 wt. % as solids, based on the total weight of the composition, the composition having a pH ranging from 3 to 5, wherein the total amount of cationic nitrogen atoms from the aminosilane on the silica particles and the compound containing two quaternary ammonium groups ranges from 170 to 500 nM/m² silica particles in the aqueous CMP polishing composition, and, further wherein, the composition is stable against visible precipitation or sedimentation at a 15 wt. % solids content after heat aging at a temperature of 45° C. for at least 6 days.

2. The aqueous chemical mechanical planarization (CMP) polishing composition as claimed in claim 1, wherein the compound containing two quaternary ammonium groups is chosen from hexabutyl $C_1$-$C_8$ alkanediammonium dihydroxides or salts thereof and the composition comprises no oxidizer compound.

3. The aqueous chemical mechanical planarization (CMP) polishing composition as claimed in claim 2, wherein the compound containing two quaternary ammonium groups is N,N,N,N',N',N'-hexabutyl-1,4-butanediammonium dihydroxide (HBBAH).

4. The aqueous chemical mechanical planarization (CMP) polishing composition as claimed in claim 1, wherein the aminosilane group containing silica particles comprise an aminosilane containing one or more tertiary amine groups or one or more secondary amine groups.

5. The aqueous chemical mechanical planarization (CMP) polishing composition as claimed in claim 4, wherein the aminosilane group containing silica particles comprise an aminosilane containing one or more tertiary amino group which is N,N-(diethylaminomethyl)triethoxysilane (DEAMS)).

6. The aqueous chemical mechanical planarization (CMP) polishing composition as claimed in claim 1, wherein the amount of aminosilane in nanomoles of cationic nitrogen atoms on the silica particle per square meter of silica particle surface area (nM/m² silica) ranges from 70 to 500 nM/m² silica in the aqueous CMP polishing composition.

7. The aqueous chemical mechanical planarization (CMP) polishing composition as claimed in claim 6, wherein the amount of aminosilane ranges from 100 to 300 nM/m² silica.

8. The aqueous chemical mechanical planarization (CMP) polishing composition as claimed in claim 1, wherein the amount of the compound containing two quaternary ammonium groups ranges from 18 to 100 nM of the compound containing two quaternary ammonium groups per m² of the silica particles (nM/m² silica) in the aqueous CMP polishing composition.

9. The aqueous chemical mechanical planarization (CMP) polishing composition as claimed in claim 1, further comprising a buffer, which is a carboxylate of a (di)carboxylic acid having a pKa of 3 to 7 in the amount of from 0 to 50 millimoles per kg of the total composition.

10. The aqueous chemical mechanical planarization (CMP) polishing composition as claimed in claim 1, wherein the composition comprises aminosilane group containing silica particles in the amount of from 15 to 22 wt. %, as solids, based on the total weight of the composition.

11. The aqueous chemical mechanical planarization (CMP) polishing composition as claimed in claim 1, wherein the compositions comprise no oxidizer compound.

* * * * *